United States Patent [19]

Rider et al.

[11] 4,152,697
[45] May 1, 1979

[54] PARALLEL RUN-LENGTH DECODER

[75] Inventors: Ronald E. Rider, Menlo Park; Butler W. Lampson, Portola Valley, both of Calif.

[73] Assignee: Xerox Corporation, Stamford, Conn.

[21] Appl. No.: 713,544

[22] Filed: Aug. 11, 1976

[51] Int. Cl.$^2$ .............................................. G06F 3/00
[52] U.S. Cl. .............................. 340/347 DD; 358/261
[58] Field of Search ............... 340/347 DD, 324 AD; 358/261, 260

[56] References Cited

U.S. PATENT DOCUMENTS

| | | | |
|---|---|---|---|
| 3,716,851 | 2/1973 | Neumann | 340/347 DD |
| 3,723,641 | 3/1973 | Heinrich | 358/261 |
| 3,748,379 | 7/1973 | Epstein | 358/261 |
| 3,925,780 | 12/1975 | Van Voorhis | 340/347 DD |
| 3,980,809 | 9/1976 | Cook | 340/347 DD |

OTHER PUBLICATIONS

Muehldorf "IBM Technical Disclosure Bulletin", vol. 15, No. 9, Feb. 1973, pp. 2693-2694.

Primary Examiner—Charles D. Miller
Attorney, Agent, or Firm—Barry Paul Smith

[57] ABSTRACT

System and method for parallel decoding of character data in run length format to produce data in dot matrix form for presentation to a display device. The data for successive runs is stored in registers and processed in parallel to provide address data for memory devices programmed to deliver predetermined output data patterns in response to the address data.

9 Claims, 4 Drawing Figures

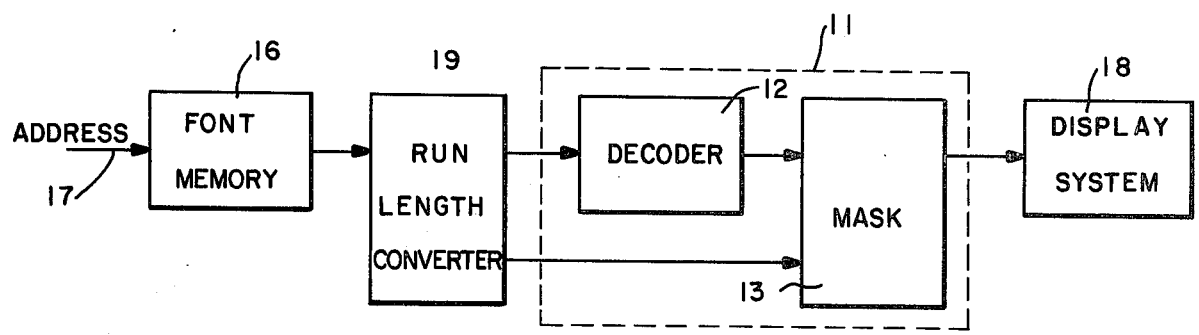
FIG.—1
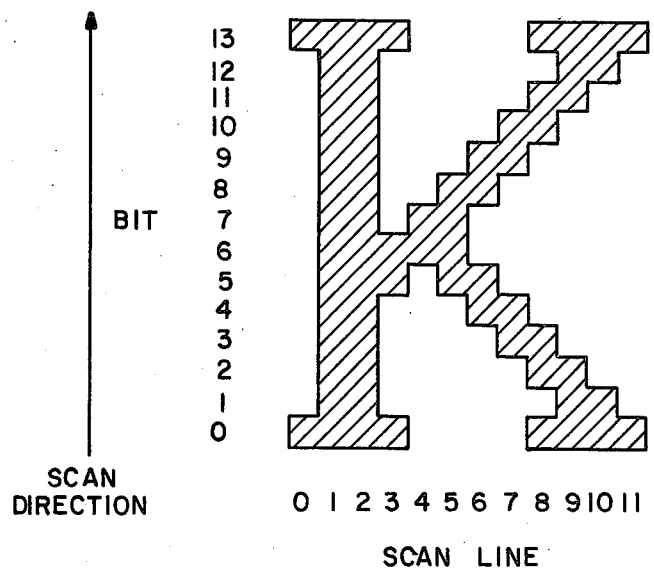
FIG.—2
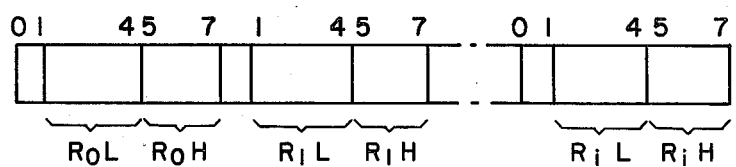
FIG.—3

PARALLEL RUN-LENGTH DECODER

This invention pertains generally to character generators and more particularly to a decoding system and method for converting binary run length data to dot matrix for display in a medium scanned in raster fashion.

A copending application filed of even date describes a high resolution character generator for generating alpha-numeric and other characters for display in dot matrix form in xerographic printers and other display devices. Data for the various characters which can be produced by the generator is stored in a font memory and accessed according to the portion of the character to be generated in each scan line. It has been found that the amount of memory space required for certain characters can be reduced substantially by storing numbers representing the lengths of successive runs of dots in the character, rather than storing a separate bit for each dot.

In order to convert the run length data to the dot matrix form in which it is to be displayed, a decoder is required. Prior art decoders for converting binary coded data to a video format have done so serially, for example, by loading the data into a counter, then shifting it out to provide the desired output format. Such techniques are relatively slow and therefore not suitable for use in xerographic printers and other high speed applications.

SUMMARY AND OBJECTS OF THE INVENTION

The invention provides a system and method for parallel decoding of character data in run length format to produce output data in dot matrix form for presentation to a display device. The data for successive runs is stored in registers and processed in parallel to provide address data for memory devices programmed to deliver predetermined output data patterns in response to the address data. Successive portions of the data are processed during successive clock cycles until all of the data for the runs in a given scan line is decoded. The data for any run which is only partly processed in one cycle is updated and the updated data is processed in the next cycle.

It is in general an object of the invention to provide a new and improved system and method for converting binary coded data to dot matrix form.

Another object of the invention is to provide a system and method of the above character in which the data is decoded in parallel.

Another object of the invention is to provide a system and method of the above character which are particularly suitable for use in a character generator operating in connection with a xerographic printer.

Additional objects and features of the invention will be apparent from the following description in which the preferred embodiments are set forth in conjunction with the accompanying drawings.

BRIEF DESCRIPTION OF THE DRAWINGS

FIG. 1 is a block diagram of a portion of a character generator incorporating the decoder of the invention.

FIG. 2 is an illustration of a letter K displayed in dot matrix form.

FIG. 3 illustrates the encoding of data in the run length format.

DESCRIPTION OF THE PREFERRED EMBODIMENT

Figure 4:
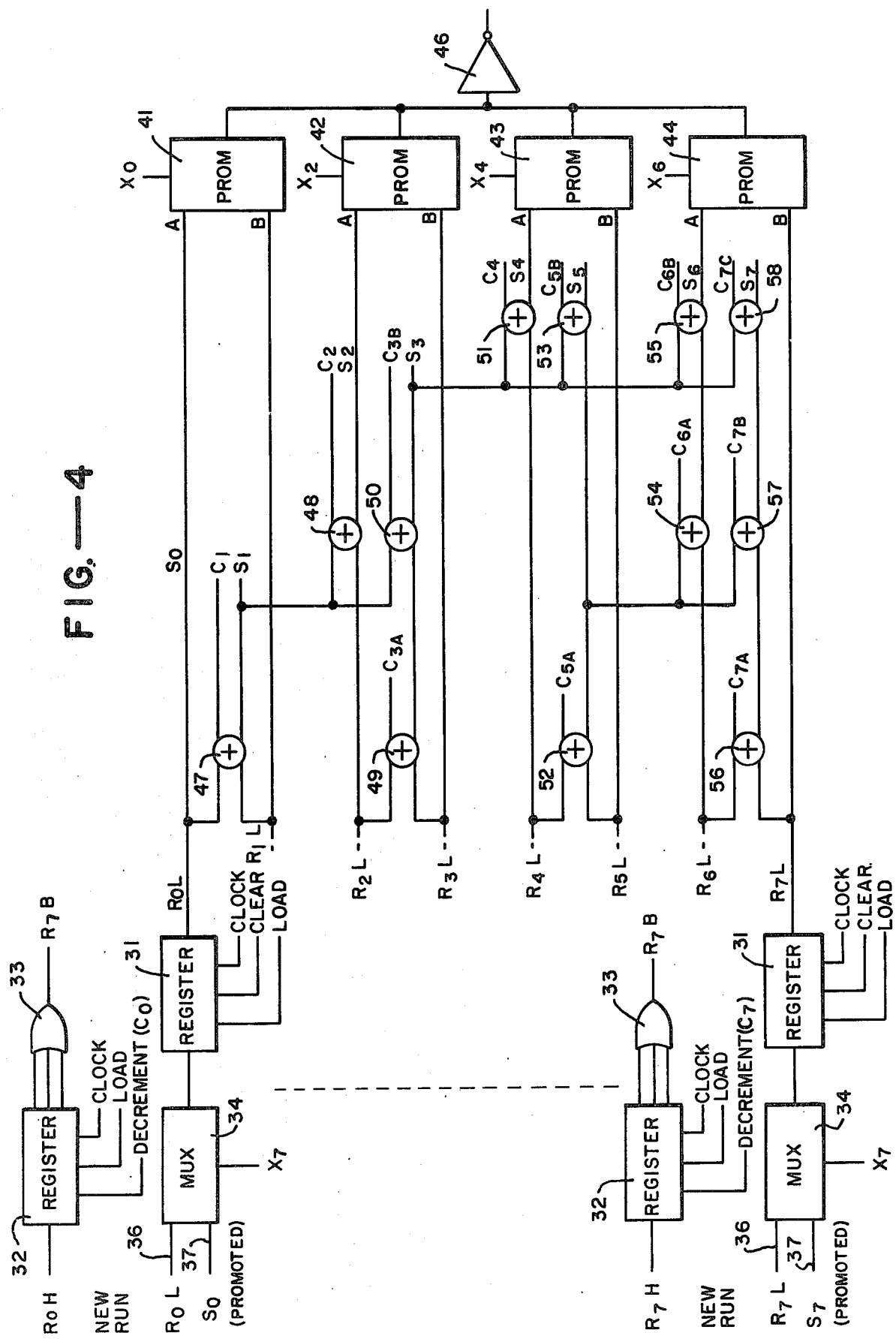
FIG. 4 is a functional block diagram of one embodiment of a decoder incorporating the invention.

In FIG. 1, the decoder 11 is illustrated in connection with a character generator of the type described in the aforesaid copending application. The decoder itself is illustrated as a two stage device, including a decoding or input stage 12 and a masking or output stage 13. The character generator includes a font memory 16 in which data defining the characters which can be produced by the generator is stored. The data is preloaded into the font memory by suitable means such as a data bus connecting the font memory directly to a computer (not shown) with which the character generator is interfaced. Data for a particular character is selected by address signals applied to the address lines 17 of the font memory.

The characters generated by the character generator are displayed on a raster scan device such as a xerographic printer in which successive portions of the characters are produced in successive scan lines. The scan lines extend in the Y direction along the long dimension of the page, and successive scan lines are displaced in the X direction. In the block diagram of FIG. 1, the raster scan device is included in the display system 18 which also includes line buffers and shift registers of the type described in the aforesaid copending application for interfacing the display device with the character generator.

In font memory 16, the data for different characters is stored in either a matrix format, a run length format, or a run length incremental format. The relationship among these formats is best understood with reference to FIG. 2, which illustrates a low resolution letter K digitized in a 12×14 bit rectangle. In the matrix format one bit is stored for each dot or element of the character, and for the illustrative letter K, fourteen bits are stored for each scan line. For scan line 0, the stored bits are

100000000001 where a 1 represents a black dot and a 0 represents a white dot.

In run length encoding, binary coded numbers representing the lengths of successive runs of black and white dots are stored, rather than storing a separate bit for each dot. The runs are arranged in pairs, with the first number in each pair representing the number of white dots in one run and the second number representing the number of black dots in the next run. The run length incremental format is similar to the run length format, except that when equal numbers of runs appear in two successive scan lines, only the incremental changes within the runs are stored. The letter K of FIG. 2 is encoded for storage in the run length and run length incremental formats as follows:

| Scan Line | Run Length | RLI |
|---|---|---|
| 0 | 0,1,12,1 | (R) 0,1,12,1 |
| 1 | 0,14 | (R) 0,14 |
| 2 | 0,14 | (I) 0,0 |
| 3 | 0,1,4,2,6,1 | (R) 0,1,4,2,6,1 |
| 4 | 6,2 | (R) 6,2 |
| 5 | 5,4 | (I) -1,2 |
| 6 | 4,2,2,2 | (R) 4,2,2,2 |
| 7 | 3,2,4,2 | (I) -1,0,2,0 |

-continued

| Scan Line | Run Length | RLI |
|---|---|---|
| 8 | 0,1,1,2,6,2,1,1 | (R) 0,1,1,2,6,2,1,1 |
| 9 | 0,3,8,3 | (R) 0,3,8,3 |
| 10 | 0,2,10,2 | (I) 0,-1,2,-1 |
| 11 | 0,1,12,1 | (I) 0,-1,2,-1 |

The output of font memory 16 is connected to a run length converter 19 which serves to convert run length incremental data to run length data for characters stored in the RLI format. Data already in the run length format passes through the run length converter unchanged and is applied to the first stage of decoder 11. Data in the matrix format also passes through the run length converter unchanged and is applied directly to the masking stage 13 of the decoder.

The decoder illustrated in FIG. 4 and described hereinafter is designed for decoding data for characters having up to eight 7-bit runs per scan line. As illustrated in FIG. 3, each run actually comprises 8 bits, but the first bit of each run is used as a flag, leaving only 7 bits to be decoded. Each run can represent up to 127 dots, and if a longer run is required, two runs can be spliced together with a zero connector. For example, 200 white dots followed by 10 black dots can be encoded 100, 0, 100, 10. If a character requires more than eight runs per scan line, that character can be stored in matrix format.

In the decoder, the most significant and least significant bits of each run are processed separately. As illustrated in FIG. 3, the 4 least significant bits of each run are designated $R_iL$ and the 3 most significant bits are designated $R_iH$, where i designated the number or level of the run. Thus, for example, $R_1L$ designates the 4 least significant bits of run 1 and $R_4H$ designates the 3 most significant bits of run 3.

As illustrated in FIG. 4, the decoder is organized in levels corresponding to the runs of data. Each level includes a first input register 31 for the 4 least significant bits of the run and a second input register 32 for the 3 most significant bits. These registers operate synchronously in response to clock pulses occurring at a suitable rate, e.g. 150 nanoseconds per cycle. In the preferred embodiment, registers 31, 32 are presettable 4-bit counters, with the input data being applied to the PRESET inputs.

The outputs of each register 32 are combined in an OR gate 33 to provide a signal $R_iB$ which indicates whether the run contains sixteen or more dots. If $R_i$ (the value of the run) is greater than or equal to 16, then $R_iH$ is greater than or equal to 1 and $R_iB$ equals 1. If $R_i$ is less than 16, then $R_iH$ equals 0 and $R_iB$ equals 0.

Each level of the decoder also includes a multiplexer 34 for selectively applying either new data for an unprocessed run or updated or promoted data for a partially processed run to 31. Each multiplexer has a first group of input lines 36 for new data and a second group of input lines 37 for updated or promoted data.

The masking or output stage 13 of the decoder includes programmable read only memories (PROM's) 41-44 which are programmed to provide predetermined patterns of output data in dot matrix format in response to predetermined addresses. Each PROM has sixteen output bits, eight address lines, and a chip select or enable line. One PROM is provided for every two of the input registers 31, and the address lines for each PROM are arranged in two 4-bit groups. Each PROM is programmed to provide A white bits (0's) followed by B black bits (1's), where A and B are the addresses applied to the respective groups of address lines. Any unused output bits following the specified numbers of black and white bits are filled with 0's. The following examples are illustrative:

| A | B | OUTPUT |
|---|---|---|
| 0000 | 0101 | 1111100000000000 |
| 0101 | 0011 | 0000011100000000 |
| 1000 | 1000 | 0000000011111111 |
| 1000 | 1010 | 0000000011111111 |
| 0101 | 0000 | 0000000000000000 |

A run pair having 0 white dots followed by 16 or more black dots is treated as a special case in which the PROM address is forced to (0, 15) and the least significant bit of the PROM output (Bit 15) is forced to 1.

The corresponding output bits of the PROM's are connected together in parallel and connected to the inputs of a 16-bit inverter 42. This connection serves to combine the outputs of the PROM's in the manner of a logical OR function.

Means is provided for translating the binary coded run length data from the input registers 31 to provide the A and B addresses for the PROM's. This means includes a plurality of 4-bit adders 47-58 connected in a tree network between the input registers and the PROM's. Each of the adders has a sum output $S_i$ and a carry output $C_i$, where i again represents the level of the decoder with which the adder is associated. Thus, for example, adder 47 is associated with the level 1 of the decoder, and its outputs are designated $S_1$ and $C_1$. The white dot data $R_0L$ from register 31 in level 0 is applied directly to the A address lines of PROM 41, and the black dot data $R_1L$, $R_3L$, $R_5L$ and $R_7L$ from the input registers is applied directly to the B address lines of the PROM's. The sum output $S_i$ of the adder associated with each level represents the total of the run data for level O through level i. Thus, for example, sum $S_3$ indicates the total number of dots represented by run 0-3, sum $S_6$ represents the total dots for runs 0-6, and so on. The sum outputs of the adders associated with runs 2, 4 and 6 are connected directly to the A address lines of PROM's 42, 43 and 44, respectively.

Several of the levels have more than one adder associated therewith. Thus, for example, adders 49 and 50 are both associated with level 3 and have carry outputs $C_{3A}$ and $C_{3B}$. When multiple adders are associated with a given level, the carry outputs of the different adders are OR-ed together to provide a single carry output for the level. Levels 3, 5, 6, and 7 all have more than one adder associated therewith, and the carry outputs for these levels are as follows:

$$C_3 = C_{3A} V C_{3B}$$

$$C_5 = C_{5A} V C_{5B}$$

$$C_6 = C_{6A} V C_{6B}$$

$$C_7 = C_{7A} V C_{7B} V C_{7C}$$

where V represents the logical operator OR.

When the decoder is utilized in the character generator of FIG. 1, the run length data from converter 19 is applied to registers 32 and to the NEW RUN inputs of multiplexers 34, and the output data from inverter 46 is presented to display system 18 for display. Data received from converter 19 in matrix format is applied to input registers 31 and passed directly to the address registers of the PROM's. From the PROM address registers, the matrix format data bypasses the PROM's and is OR-ed directly into the PROM output lines.

The PROM's are individually enabled and disabled by signals $x_i$ applied to the chip select lines of the PROM's. A PROM is enabled when the applied $x_i=0$ and disabled when $x_i=1$. $x_i$ is defined as follows:

$$T_i = R_iB \vee C_i$$

$$x_i = \bigvee_{i=0}^{i} T_i$$

$$= T_0 \vee T_1 \ldots \vee T_i$$

$$= R_0B \vee C_0 \vee R_1B \vee C_1 \ldots R_iB \vee C_i$$

$T_i$ is true (1) only when an overflow occurs in level i, that is when $R_iB=1$ or $C_i=1$, and $x_i$ is true if an overflow occurs at any level up to and including level i. The occurrence of an overflow indicates the presence of sufficient data to produce 16 decoded output bits. The signals for $x_i$ are readily obtained by OR gates (not shown) which combine the outputs of gates 33 and the carry outputs of adders 47–58 in the manner set forth above.

Operation and use of the decoder and therein the method of the invention are as follows. The binary coded run length data from converter 19 is entered into input registers 31, 32 and the resulting addresses for the PROM's are allowed to settle. The PROM's are individually disabled by $x_i$, and the resulting 16-bit output will be the first sixteen bits of the decoded runs in matrix format. The remaining output bits are produced in 16-bit cycles, and the run length data $R_iL$, $R_iH$ is updated after each cycle. In the updating process, the data for each run is either zeroed ($Z_i$), promoted ($P_i$) or left unchanged. Runs are zeroed after they have exhausted, promoted when they are partially exhausted, and left along if they have not begun to be processed. The algorithms for promoting and zeroing the runs can be expressed as follows:

$$P_i = *X_{i-1} \wedge T_i$$

$$Z_i = *X_i$$

where $*X_{i-1}$ is the complement of $X_{i-1}$, the symbol $\wedge$ is the logical operator AND, and $X_{-1}$ is assumed to be false (0). It will be noted that $*X_i=1$ only if the data for level i and all runs below that level totals 15 bits or less. Thus, $*X_{i-1}$ indicates that no overflow has occurred through level $i-1$, and $P_i$ indicates that an overflow occurs in level i.

The run length in registers 31, 32 is promoted as follows:

$$R_iL = S_i$$

$$R_iH = R_iH - (R_iB * C_i) = R_iH - *C_i$$

These relationships are implemented by connecting the sum outputs of the adders to the promoted data input lines 37 of the multiplexers 34 and by connecting the carry outputs of the adders to the DECREMENT lines of registers 32. The decoding of the data for all runs is complete if $*X_7=1$, that is if $X_7=0$.

A signal corresponding to $X_7$ is applied to the SELECT input lines of multiplexers 34 to determine whether the $R_iL$ data applied to registers 31 is the data for a new run or the promoted data for an old run. LOAD and CLEAR signals are applied to registers 31 as follows:

$$LOAD = P_i \vee *X_7$$

$$CLEAR = Z_i$$

From these relationships, it will be noted that the $R_iL$ data in register 31 is promoted if $P_i=1$ and data for a new run is entered if $*X_7=1$. The register is cleared or reset to 0 if $Z_1=1$.

The operation of registers 32 is controlled by LOAD and DECREMENT signals as follows:

$$LOAD = *X_7$$

$$DECREMENT = P_i \wedge *C_i$$

Data for a new run is loaded into these registers when $*X_7=1$.

The operation of the decoder can be further understood from the following example in which it is assumed that the following runs of black and white dots are to be generated in a scan line:

0W, 8B, 5W, 12B, 7W, 10B, 17W, 5B.

When this data is loaded into registers 31, 32, $R_iL$ and $R_iH$ will have the following values:

| i | $R_iL$ | $R_iH$ |
|---|--------|--------|
| 0 | 0000   | 000    |
| 1 | 1000   | 000    |
| 2 | 0101   | 000    |
| 3 | 1010   | 000    |
| 4 | 0111   | 000    |
| 5 | 1001   | 000    |
| 6 | 0001   | 001    |
| 7 | 0101   | 000    |

During the first cycle in which this data is processed, an overflow occurs in level 3 where $C_3=1$. Therefore, $T_3=1$, $X_3$ and all higher levels of $X_i$ equal 1, and PROM's 43 and 44 are disabled. PROM's 41 and 42 receive the following addresses and provide the following outputs:

| PROM | A    | B    | OUTPUT           |
|------|------|------|------------------|
| 41   | 0000 | 1000 | 1111111100000000 |
| 42   | 1101 | 1010 | 0000000000000111 |

OR-ing these outputs together gives an output mask of 1111111100000111, which is the desired bit pattern for runs 0–2 and the first 3 bits of run 3.

On the next clock pulse, the fully decoded data for runs 0–2 is zeroed and the partly processed data for run 3 is promoted. The data for the remaining runs is left unchanged because it has not been processed. The updated data for runs 0–3 is as follows:

| i | $R_iL$ | $R_iH$ |
|---|--------|--------|
| 0 | 0000   | 000    |
| 1 | 0000   | 000    |
| 2 | 0000   | 000    |
| 3 | 1001   | 000    |

During the second cycle, an overflow occurs in level 4 where $C_4=1$. Therefore, $T_4=1$, $X_4$ and all higher levels of $X_i$ equals 1, and only PROM's 41 and 42 are enabled. The states of the PROM's are now as follows:

| PROM | A | B | OUTPUTS |
|---|---|---|---|
| 41 | 0000 | 0000 | 0 0 0 0 0 0 0 0 0 0 0 0 0 0 0 0 |
| 42 | 0000 | 1001 | 1 1 1 1 1 1 1 1 0 0 0 0 0 0 0 0 |

When OR-ed together, these outputs give an output mask of 1111111110000000, which is the desired bit pattern for the last 9 bits of run 3 and all 7 bits of run 4.

On the next clock pulse, the data for newly exhausted runs 3 and 4 is zeroed, and the data for the remaining runs is unchanged. During the third cycle, an overflow occurs in level 6, where $C_{6A}=1$ and $R_6B=1$. Therefore, $T_6=1$, $X_6$ and $X_7$ equal 1, and PROM 44 is disabled. The states of PROM's 41–43 are now as follows:

| PROM | A | B | OUTPUTS |
|---|---|---|---|
| 41 | 0000 | 0000 | 0 0 0 0 0 0 0 0 0 0 0 0 0 0 0 0 |
| 42 | 0000 | 0000 | 0 0 0 0 0 0 0 0 0 0 0 0 0 0 0 0 |
| 43 | 0000 | 1010 | 1 1 1 1 1 1 1 1 1 1 0 0 0 0 0 0 |

When OR-ed together, these outputs give an output mask of 1111111111000000, which is the desired bit pattern for all of run 5 and the first 6 bits of run 6.

On the next clock pulse, the data for run 5 is zeroed and the data for run 6 is promoted as follows:

| i | $R_iL$ | $R_iH$ |
|---|---|---|
| 5 | 0000 | 000 |
| 6 | 1011 | 000 |

During the fourth cycle, an overflow occurs in level 7 where $C_{7A}=1$. Therefore, $T_7=1$, only $X_7=1$, and all of the PROM's are enabled. The states of the PROM's are now as follows:

| PROM | A | B | OUTPUTS |
|---|---|---|---|
| 41 | 0000 | 0000 | 0 0 0 0 0 0 0 0 0 0 0 0 0 0 0 0 |
| 42 | 0000 | 0000 | 0 0 0 0 0 0 0 0 0 0 0 0 0 0 0 0 |
| 43 | 0000 | 0000 | 0 0 0 0 0 0 0 0 0 0 0 0 0 0 0 0 |
| 44 | 1011 | 0101 | 0 0 0 0 0 0 0 0 0 0 0 1 1 1 1 1 |

When OR-ed together, these outputs give an output mask of 0000000000011111, which is the desired bit pattern for the last 11 bits of run 6 and all 5 bits of run 7.

At this point, the runs are fully decoded. On the next clock pulse, $X_7$ becomes 0, and the data for new runs is loaded into the input registers.

The invention has a number of important features and advantages. By operating in a parallel mode, it provides rapid conversion of binary data to video form, for example, at a rate of 16 bits per 150 nanosecond clock pulse.

It is apparent from the foregoing that a new and improved system and method for decoding binary data have been provided. While only the presently preferred embodiments have been described, as will be apparent to those familiar with the art, certain changes and modifications can be made without departing from the scope of the invention as defined by the following claims.

What is claimed is:

1. A decoder for parallel conversion of binary run length data to a dot matrix format for presentation to a display, comprising: register means for storing binary coded data representing the lengths of successive runs of dots to be displayed, output means for selectively delivering predetermined patterns of output data in the dot matrix format in accordance with input signals applied thereto, and means responsive concurrently to a plurality of digits of the coded data in the register means for applying input signals to the output means to cause said means to deliver output data patterns for runs of the lengths represented by the coded data.

2. The decoder of claim 1 wherein the output means comprises a programmable read only memory.

3. The decoder of claim 1 wherein the means for applying input signals to the output means comprises a plurality of binary adders connected in a tree network between the register means and the output means.

4. In a system for generating characters for display in a dot matrix format on a medium scanned in discrete lines: means for providing coded number data representing the lengths of successive runs of dots in each scan line passing through a character, means for decoding a plurality of the digits of the number data in parallel, and means for providing output data patterns in the dot matrix format for presentation to the display medium.

5. The system of claim 4 wherein the means for providing output data patterns includes a memory device programmed to provide predetermined output data patterns in response to predetermined address inputs, and said means for decoding includes means responsive to the coded data for applying address inputs to the memory device, whereby the data patterns produced by the output device correspond to the coded data.

6. In a decoder for converting binary coded run length data to a dot matrix format for display on a medium scanned in discrete lines: a plurality of input registers, means for applying the data for successive runs to successive ones of the registers, memory means programmed to provide predetermined output data patterns in the dot matrix format in response to address inputs applied thereto, and a plurality of binary adders connected in a tree network between the input registers and the memory means for parallel processing of the run length data to provide address inputs for the memory means.

7. The decoder of claim 6 wherein the memory means comprises a plurality of programmable read only memories (PROM's) and means for combining the outputs of the PROM's in a logical OR function.

8. The decoder of claim 6 wherein successive portions of the data are decoded during successive clock cycles, together with means for clearing the register for each run when all of the data for that run has been decoded.

9. The decoder of claim 6 wherein successive portions of the data are decoded during successive clock cycles and the means for applying the data to each input register includes means for replacing the data for a partially decoded run with the portion of the data yet to be decoded for that run.

* * * * *